United States Patent
Hao et al.

(10) Patent No.: US 11,232,728 B2
(45) Date of Patent: Jan. 25, 2022

(54) DISPLAY PANEL AND CRACK DETECTING METHOD THEREOF, DISPLAY APPARATUS

(71) Applicant: BOE TECHNOLOGY GROUP CO., LTD., Beijing (CN)

(72) Inventors: Xueguang Hao, Beijing (CN); Yong Qiao, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/486,820

(22) PCT Filed: Jan. 8, 2019

(86) PCT No.: PCT/CN2019/070860
§ 371 (c)(1),
(2) Date: Aug. 16, 2019

(87) PCT Pub. No.: WO2019/218709
PCT Pub. Date: Nov. 21, 2019

(65) Prior Publication Data
US 2020/0066196 A1    Feb. 27, 2020

(30) Foreign Application Priority Data
May 17, 2018   (CN) .......................... 201810473966.5

(51) Int. Cl.
*G09G 3/00* (2006.01)
*G09G 3/3258* (2016.01)
(Continued)

(52) U.S. Cl.
CPC ........... *G09G 3/006* (2013.01); *G09G 3/3258* (2013.01); *G09G 3/3275* (2013.01);
(Continued)

(58) Field of Classification Search
CPC .......... G01N 27/00; G09G 3/006; G09G 3/20; G09G 3/3275; G09G 3/3258; G09G 3/00;
(Continued)

(56) References Cited

U.S. PATENT DOCUMENTS 10,096,667 B2 * 10/2018 Park ........................ H01L 22/34
10,522,431 B2 * 12/2019 Kim ....................... G09G 3/006
(Continued)

FOREIGN PATENT DOCUMENTS

CN            208111041 U     11/2014
CN            104535620 A      4/2015
(Continued)

OTHER PUBLICATIONS

Notification of Reason for Refusal dated Jan. 27, 2021 for Korean Patent Application No. 10-2019-7034891, 13 pages.

*Primary Examiner* — Vinh T Lam
(74) *Attorney, Agent, or Firm* — Dave Law Group LLC; Raj S. Dave

(57) ABSTRACT

A display panel and a crack detecting method, and a display device are disclosed. The display panel includes a display region and a peripheral region surrounding the display region, the peripheral region being provided with a crack detection circuit structure, the crack detection circuit structure including a detection circuit wire and a first detection switching circuit, the display panel includes a first sub-pixel and a first data line electrically connected to the first sub-pixel, a first end of the first data line is electrically connected to a first end of the detection circuit, a second end of the first data line is electrically connected to a second end of the detection circuit wire through the first detection switching circuit and the second end of the detection circuit wire is configured to receive a detection voltage.

19 Claims, 12 Drawing Sheets

(51) Int. Cl.
*G09G 3/3275* (2016.01)
*H01L 27/32* (2006.01)

(52) U.S. Cl.
CPC ..... *H01L 27/3223* (2013.01); *G09G 2320/04* (2013.01); *G09G 2330/02* (2013.01)

(58) Field of Classification Search
CPC ............ G09G 2320/04; G09G 2330/02; H01L 27/3223
See application file for complete search history.

(56) References Cited

U.S. PATENT DOCUMENTS

| | | | |
|---|---|---|---|
| 2014/0176844 A1* | 6/2014 | Yanagisawa | G09G 3/006 349/43 |
| 2015/0022211 A1* | 1/2015 | Du | G09G 3/006 324/414 |
| 2016/0043010 A1* | 2/2016 | Kwak | H01L 51/0024 257/48 |
| 2016/0225312 A1* | 8/2016 | Byun | G09G 3/006 |
| 2016/0351093 A1* | 12/2016 | Kim | G09G 3/2092 |
| 2018/0033354 A1* | 2/2018 | Lee | G09G 3/006 |
| 2018/0033355 A1* | 2/2018 | Lee | H01L 27/3276 |
| 2018/0047804 A1 | 2/2018 | Zhou et al. | |
| 2019/0019441 A1* | 1/2019 | Shin | G09G 3/3233 |
| 2019/0180663 A1 | 6/2019 | Lee et al. | |

FOREIGN PATENT DOCUMENTS

| | | |
|---|---|---|
| CN | 105374311 A | 3/2016 |
| CN | 106206654 A | 12/2016 |
| CN | 106875879 A | 6/2017 |
| CN | 107680481 A | 2/2018 |
| JP | 2014-122974 A | 7/2014 |
| KR | 1020180014906 A | 2/2018 |

* cited by examiner

DISPLAY PANEL AND CRACK DETECTING METHOD THEREOF, DISPLAY APPARATUS

CROSS-REFERENCE TO RELATED APPLICATIONS

The present application is a U.S. national stage of International Patent Application No.: PCT/CN2019/070860, files Jan. 8, 2019, which claims priority of China Patent application No. 201810473966.5 filed on May 17, 2018, the contents of which are incorporated in their entireties as portion of the present application by reference herein.

TECHNICAL FIELD

At least one embodiment of the present disclosure relates to a display panel and a crack detecting method thereof, and a display apparatus.

BACKGROUND

Generally speaking, tiny cracks are prone to occur in a packaging film layer, a flexible substrate or glass at the periphery of a display panel, resulting in the fact that water vapor in the surrounding environment enters a display region along cracks at the periphery. Thus, metal wirings of a display device are corroded or an organic light emitting film layer is encroached, and in turn, malfunction of the display panel results. At present, cracks are prevented mainly by setting up an anti-crack structure in a peripheral region of the display panel.

SUMMARY

At least one embodiment of the present disclosure provides a display panel, including a display region and a peripheral region surrounding the display region, the peripheral region being provided with a crack detection circuit structure, the crack detection circuit structure including a detection circuit wire and a first detection switching circuit, the display panel includes a first sub-pixel and a first data line electrically connected to the first sub-pixel, a first end of the first data line is electrically connected to a first end of the detection circuit wire, a second end of the first data line is electrically connected to a second end of the detection circuit wire through the first detection switching circuit, and the second end of the detection circuit wire is used for receiving a detection voltage.

In some examples, the first sub-pixel and the first data line are located in the display region.

In some examples, the detection voltage is equal to a power supply voltage.

In some examples, the display panel further includes a voltage applying portion, wherein the voltage applying portion is electrically connected to the second end of the detection circuit wire and is used for applying the detection voltage to the detection circuit wire.

In some examples, the voltage applying portion includes a first contact pad disposed in the peripheral region, the first contact pad is configured to contact a detection probe.

In some examples, the voltage applying portion includes a first contact pad disposed in the peripheral region, the first contact pad is configured to be electrically connected to a drive circuit board.

In some examples, the display panel further includes an on-off signal applying portion, wherein the on-off signal applying portion is electrically connected to a control terminal of the first detection switching circuit, and is used for applying an on/off signal to the first detection switching circuit so as to control on or off state of the first detection switching circuit.

In some examples, the on-off signal applying portion includes a second contact pad disposed in the peripheral region, the second contact pad is configured to contact a detection probe or to be electrically connected to a drive circuit board.

In some examples, the voltage applying portion includes a second contact pad disposed in the peripheral region, the second contact pad is configured to be electrically connected to a drive circuit board.

In some examples, the first detection switching circuit includes at least one thin film transistor, a gate electrode of the thin film transistor is electrically connected to the on-off signal applying portion, one of source electrode and drain electrode of the thin film transistor is electrically connected to the first data line, and the other one of the source electrode and drain electrode of the thin film transistor is electrically connected to the second end of the detection circuit wire.

In some examples, the display panel further includes a resistance element, wherein the resistance element is connected between the second end of the first data line and the first detection switching circuit, or connected between the first detection switching circuit and the second end of the detection circuit wire.

In some examples, the detection circuit wire is disposed to surround the display region.

In some examples, the detection circuit wire includes a serpentine structure.

In some examples, the display region is further provided with a second sub-pixel and a second data line electrically connected to the second sub-pixel, the display panel further includes a second detection switching circuit, and the on-off signal applying portion is connected to a control terminal of the second detection switching circuit, the second data line is electrically connected to the second detection switching circuit and is capable of receiving a data signal of the display panel for display of a black picture or a white picture through the second detection switching circuit.

In some examples, luminous color of the first sub-pixel and the second sub-pixel differs.

In some examples, each of the first sub-pixel and the second sub-pixel includes a pixel driving circuit and an organic light emitting element, and the pixel driving circuit is configured not to output a driving current upon the received display data voltage being equal to a power supply voltage.

At least one embodiment of the present disclosure provides a display apparatus, including the display panel according to any one of the above examples.

At least one embodiment of the present disclosure provides a crack detecting method of a display panel, wherein the display panel is the display panel according to any one of the above examples, the method includes: displaying a black picture by using the display panel, turning on the first detection switching circuit, and applying the detection voltage to the second end of the detection circuit wire; or displaying a white picture by using the display panel, turning on the first detection switching circuit, and applying the detection voltage to the second end of the detection circuit wire.

In some examples, in a case of displaying the black picture, if the first sub-pixel emits light, then it is judged that a crack appears in the peripheral region; or, in a case of displaying the white picture, if the first sub-pixel does not emit light, then it is judged that no crack appears in the peripheral region.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1A:
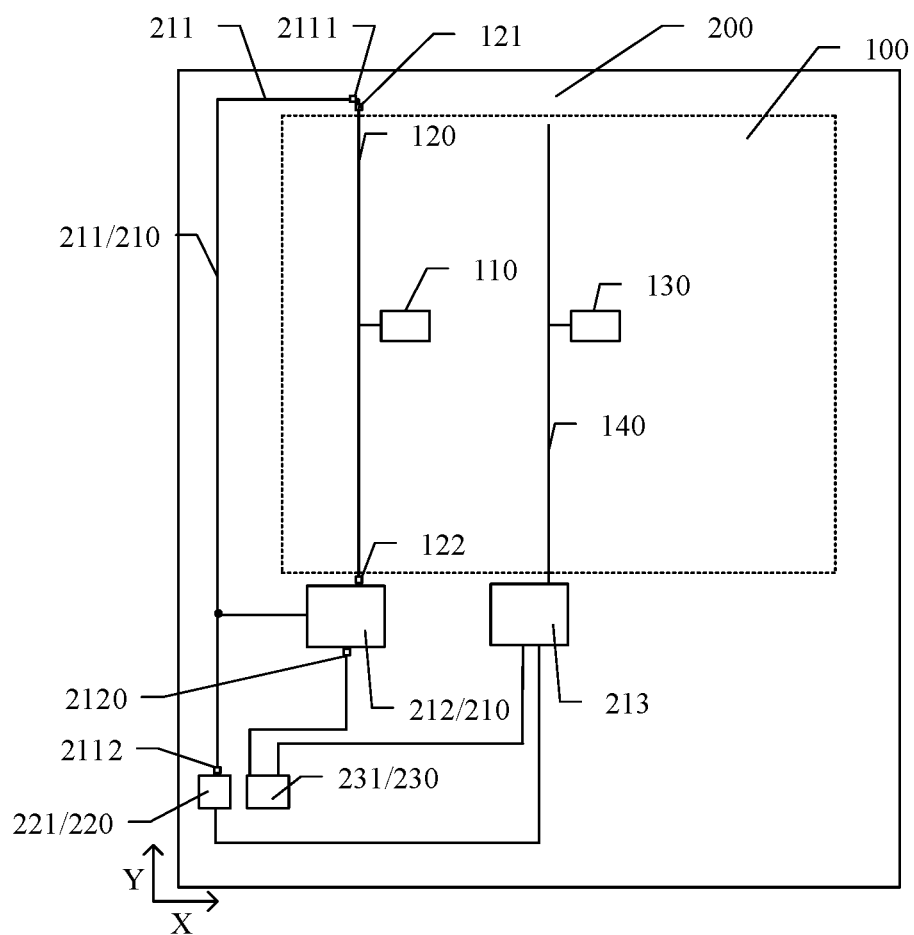
FIG. 1A is a schematic diagram of a partial simplified structure of a display panel provided by an example of an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The terms "connection", "connected" and the like are not limited to physical or mechanical connection but may include electrical connection, either directly or indirectly.

In the study, the inventor(s) of the present application has noticed that, occurrence of tiny cracks cannot be prevented completely by an anti-crack structure currently used in a display panel in general, and cracks will still occur at the partial periphery of the display panel. However, this kind of tiny cracks cannot be observed by naked eyes, thus, a convenient, highly efficient method to detect tiny cracks occurring at the periphery of a display panel is needed.

At least one embodiment of the present disclosure provides a display panel and a crack detecting method thereof, and a display apparatus. The display panel includes a display region and a peripheral region surrounding the display region, the display region is provided with a first sub-pixel and a first data line electrically connected to the first sub-pixel, and the peripheral region is provided with a crack detection circuit structure, which includes a detection circuit wire and a first detection switching circuit. A first end of the first data line is electrically connected to a first end of the detection circuit wire, a second end of the first data line is electrically connected to a second end of the detection circuit wire through the first detection switching circuit, and the second end of the detection circuit wire is used to receive a detection voltage.

The crack detection circuit structure included in the display panel in the embodiment of the present disclosure can detect tiny cracks at the periphery of a display panel, so that defective products can be picked out in time, which can effectively prevent the problem that metal circuitry of display devices is corroded during the subsequent use of this defective display panel due to entrance of external water vapor into the display panel, and then malfunction of the display panel occurs.

Hereinafter, the display panel and the crack detecting method thereof, and the display apparatus provided by embodiments of the present disclosure will be described below in conjunction with the accompanying drawings.

An embodiment of the present disclosure provides a display panel, and FIG. 1A is a schematic diagram of a partial simplified structure of a display panel provided by an example of the present embodiment.

As illustrated by FIG. 1A, the display panel includes a display region 100 and a peripheral region 200 surrounding the display region 100. The display region 100 is provided with a sub-pixel array including a plurality of sub-pixels as well as a plurality of gate lines (not shown in the figure) for providing scanning signals to the sub-pixel array and a plurality of data lines for providing data signals. These gate lines extend in a direction parallel to the X direction, and for example, each of the gate lines corresponds to one row of the plurality of sub-pixels; these data lines extend in a direction parallel to the Y direction, and for example, each of the data lines corresponds to one column of the plurality of sub-pixels. The plurality of sub-pixels include at least one first sub-pixel 110, and correspondingly, the plurality of data lines include at least one first data line 120 electrically connected to the first sub-pixel 110. The combination of sub-pixels of different colors can form pixel units, and for example, one red sub-pixel, one green sub-pixel and one blue sub-pixel are combined to form one pixel unit.

FIG. 1A merely exemplarily illustrates one first sub-pixel 110 electrically connected to one first data line 120, but it should be understood that, for example, first sub-pixels 110 in one column are electrically connected to the same first data line 120 in the display region 100, and the first sub-pixels 110 in this column are sub-pixels for displaying the same color (e.g., green). The first data line 120 included in the display panel refers to at least one first data line 120, and for example, in a case where a plurality of first data lines 120 are present, first sub-pixels 110 in different columns that are electrically connected to different first data lines 120, and may display either the same color, or different colors.

As illustrated by FIG. 1A, the peripheral region 200 of the display panel is provided with a crack detection circuit structure 210, which includes at least one detection circuit wire 211 and at least one first detection switching circuit 212. As illustrated by FIG. 1A, a first end of a first data line 120 is electrically connected to a first end 2111 of the detection circuit wire 211, and a second end 122 of the first data line 120 opposite to the first end 121 is electrically connected to a second end 2112 of the detection circuit wire 211 opposite to the first end 2111 through the first detection switching circuit 212, the second end 2112 of the detection circuit wire 211 is used to receive a detection voltage. It is to be noted that, embodiments of the present disclosure include but are not limited thereto, and the first data line and the first sub pixel may also be a data line and a sub pixel which are additionally arranged outside the display region. Upon the first data line and first pixel being arranged in the display region, on the one hand, the material and process can be saved, and on the other hand, the detection circuit wire can be extended to the whole periphery of the display region, thus increasing the detection range.

It is to be noted that, the above first end 121 of the first data line 120 refers to one side of the first data line 120, the first end 2111 of the detection circuit wire 211 refers to one side connected to the first end 121 of the first data line 120, and they are not required to be actual endpoints or ends. For example, in a case where the first end 2111 of at least one first data line 211 is electrically connected to the first end 2111 of a detection circuit wire 211, the first end 2111 of the detection circuit wire 211 is the connection side of the detection circuit wire 211 connected with the first end 121 of the first data line 120. Similarly, the second end 122 of the first data line 120 refers to the other side of the first data line 120, the second end 2112 of the detection circuit wire 211 is a side connected with a voltage applying portion 220 as mentioned subsequently, and they are not required to be actual endpoints or ends. For the sake of clarity, only the first end 121 of the first data line 120, the first end 2111 of the detection circuit wire 211, the second end 122 of the first data line 120 and the second end 2112 of the detection circuit wire 211 are schematically denoted in FIG. 1A.

In addition, it is to be noted that, the first data line in the display panel refers only to a data line electrically connected to a detection circuit wire. The first data line 120 electrically connected to the detection circuit wire 211, the first sub-pixel 110 electrically connected to the first data line 120 and the crack detection circuit structure 210 shown in FIG. 1A jointly function as a crack detecting structure for detecting and judging whether cracks appear in a peripheral region of the display panel.

For the display panel provided by the present embodiment, upon tiny cracks occurring in the peripheral region of the display panel, the display panel can be picked out in time by a detection of applying a voltage, so as to effectively prevent the problem that metal circuitry of display devices is corroded during the subsequent use of this defective display panel due to entrance of external water vapor into the display panel, and then malfunction of the display panel occurs.

For example, as illustrated by FIG. 1A, the display panel further includes a voltage applying portion 220, which is electrically connected to the second end 2112 of the detection circuit wire 211, and is used for applying a detection voltage to the detection circuit wire 211. In a case where the first detection switching circuit 212 is in a conducting state, a detection voltage is also applied to the first data line 120 while the voltage applying portion 220 applies the detection voltage to the detection circuit wire 211. For example, the detection voltage applied to the first data line 120 may be a power supply voltage (Vdd) at which the first sub-pixel 110 is used for display.

For example, the voltage applying portion 220 may have different implementing modes, and for example, it may be at least one selected from the group consisting of an electrical signal test pad (ET test Pad) and a flexible printed circuit bonding pad (FPC Bonding Pad). Therefore, according to different implementing modes of the voltage applying portion 220, the crack detection circuit structure in the display panel has different connecting modes, and has different crack test modes correspondingly. In a case where the voltage applying portion 220 is an electrical signal test pad, a corresponding crack test may be carried out at an electrical test phase of the display panel; and in a case where the voltage applying portion 220 is a flexible printed circuit bonding pad, a corresponding crack test may be carried out at a module test phase of the display panel.

For example, as illustrated by FIG. 1A, in an example, the voltage applying portion 220 includes a first contact pad 221 arranged in the peripheral region, which may be configured to contact a detection probe (not shown in the figure). The detection probe may be connected to a detection apparatus or the like located outside the display panel, thereby providing a voltage to the voltage applying portion 220, so as to apply the detection voltage to the detection circuit wire 211.

For example, in another example, the first contact pad 221 may also be configured to be electrically connected with a drive circuit board (not shown in the figure), which may be arranged either inside the display panel, or outside the display panel, and installed on the display panel in a manner such as flexible circuit board (FPC) or the like. The drive circuit board provides a voltage to the voltage applying portion 220, so as to apply the detection voltage to the detection circuit wire 211.

For example, as illustrated by FIG. 1A, the display panel further includes an on-off signal applying portion 230, which is electrically connected to a control terminal 2120 of the first detection switching circuit 212, and used for applying an on/off signal to the first detection switching circuit 212 for controlling the on or off state of the first detection switching circuit 212.

For example, the on-off signal applying portion 230 may have different implementing modes, and for example, it may be at least one selected from the group consisting of an electrical signal test pad and a flexible printed circuit pad likewise. Therefore, according to different implementing modes of the on-off signal applying portion 230, the crack detection circuit structure in the display panel has different connecting modes.

For example, as illustrated by FIG. 1A, in an example, the on-off signal applying portion 230 includes a second contact pad 231 arranged in the peripheral region 200, which may be configured to contact a detection probe (not shown in the figure). The detection probe may be connected to a detection apparatus or the like located outside the display panel, thereby providing a voltage to the on-off signal applying portion 230, for controlling the on or off state of the first detection switching circuit 212.

For example, in another example, the second contact pad 231 may also be configured to be electrically connected with a drive circuit board (not shown in the figure), which may be arranged either inside the display panel, or outside the display panel, and installed on the display panel in a manner such as flexible circuit board or the like. The drive circuit board provides a voltage for the on-off signal applying portion 230, so as to control the on or off state of the first detection switching circuit 212.

For example, the voltage applying portion and the on-off signal applying portion in the present embodiment may be of the same type, and for example, the voltage applying portion and the on-off signal applying portion may both be electrical signal test pads or flexible printed circuit bonding pads. The present embodiment is not limited thereto.

For example, the voltage applying portion and the on-off signal applying portion may also be of different types, and for example, one of the voltage applying portion and the on-off signal applying portion is one of an electrical signal test pad and a flexible printed circuit bonding pad, and the other one of them is the other of the electrical signal test pad and the flexible printed circuit bonding pad. The present embodiment is not limited thereto, and design can be made according to the actual situation.

For example, as illustrated by FIG. 1A, the display region 100 of the display panel is further provided with a second sub-pixel 130 and a second data line 140 electrically connected to the second sub-pixel 130. The second data line 140 is a data line that is not electrically connected to the detection circuit wire 211; in the display region 100, second sub-pixels 130 in one column are electrically connected to the same second data line 140, and the second sub-pixels 130 in this column are sub-pixels for displaying the same color (e.g. red or blue).

FIG. 1A merely exemplarily illustrates one second sub-pixel 130 electrically connected to the second data line 140, and the second data line 140 included in the display panel refers to at least one second data line 140. For example, in a case where a plurality of second data lines 140 are present, second sub-pixels 130 in different columns which are electrically connected to different second data lines 140 may display either the same color, or different colors.

For example, a first sub-pixel 110 and a second sub-pixel 130 may be of the same color, and for example, the first sub-pixel 110 and the second sub-pixel 130 are not adjacent to each other and belong to different pixel units.

For example, color of the first sub-pixel 110 is different from that of the second sub-pixel 130. For example, the first sub-pixel 110 is a green sub-pixel, and the second sub-pixel 130 is a blue sub-pixel and/or a red sub-pixel. The present embodiment is not limited thereto.

For example, as illustrated by FIG. 1A, in an example, the display panel further includes a second detection switching circuit 213, and the on-off signal applying portion 230 may be connected to a control terminal of the second detection switching circuit 213, for controlling the on or off state of the second detection switching circuit 213. A first terminal of the second detection switching circuit 213 is electrically connected to the second data line 140, and a second terminal of the second detection switching circuit 213 may be electrically connected to the voltage applying portion 220.

For example, the second detection switching circuit 213 may include a thin film transistor, the on-off signal applying portion 230 may be connected to a gate electrode of the thin film transistor for controlling the on or off state of the second detection switching circuit. One of source electrode and drain electrode of the thin film transistor included in the second detection switching circuit is electrically connected to the second data line 140, and the other one of the source electrode and drain electrode of the thin film transistor included in the second detection switching circuit is used for receiving a data signal of the display panel for the display of a black picture or a white picture.

For example, as illustrated by FIG. 1A, the second data line 140 may be electrically connected to the voltage applying portion 220 through the second detection switching circuit 213. Upon the on-off signal applying portion 230 controls the second detection switching circuit 213 in a conducting state, the voltage applying portion 220 applies a voltage to the second data line 140 through the second detection switching circuit 213, so that the display panel is used to display a black picture or a white picture.

For example, the voltage applying portion 220 may include a plurality of voltage applying sub-portions, so as to apply different voltages to the second data line 140 and the first data line 120, respectively.

For example, the second data line 140 may also be connected to other component for providing a voltage signal different from the voltage applying portion 220 through the second detection switching circuit 213, and the present embodiment is not limited thereto.

For example, the second detection switching circuit 213 may also be connected by other component for providing an on/off signal different from the on-off signal applying portion 230, as long as the second detection switching circuit 213 can be turned on simultaneous with the first detection switching circuit 212.

Figure 1B:
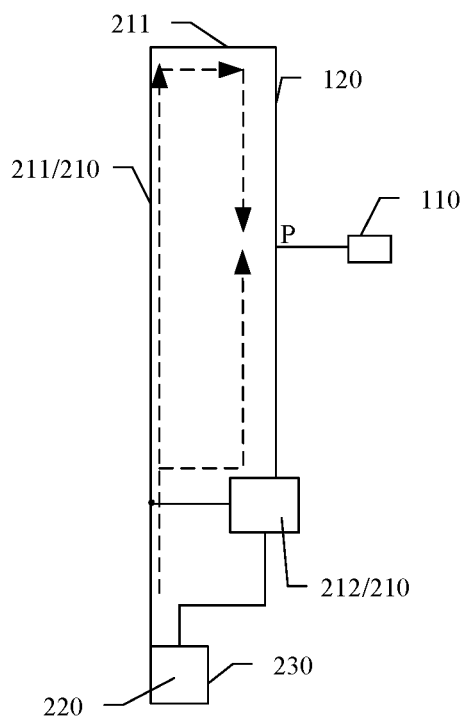
FIG. 1B and FIG. 1C are schematic diagrams illustrating a principle for judging whether a crack occurs in a peripheral region of a display panel provided by an embodiment of the present disclosure.
Figure 1C:
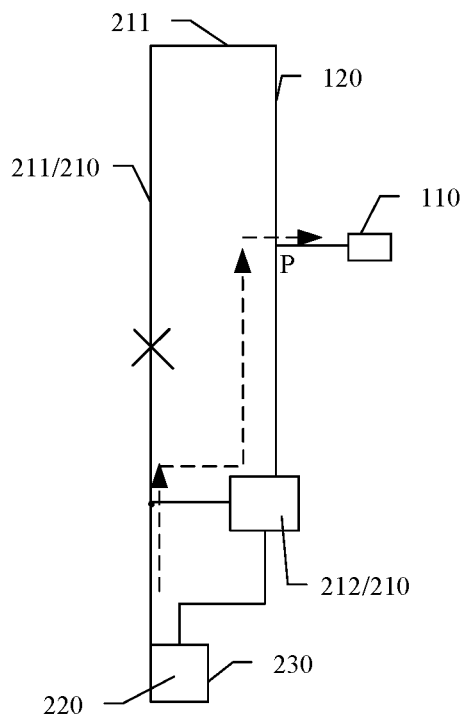

FIG. 1B and FIG. 1C are schematic diagrams illustrating a principle of judging whether cracks occur in a peripheral region of the display panel provided by an embodiment of the present disclosure. In the principle schematic diagrams shown in FIG. 1B and FIG. 1C, descriptions will be made with reference to an example in which the voltage applying portion and the on-off signal applying portion are the same component, but the present embodiment is not limited thereto.

For example, as illustrated by FIG. 1B, the on-off signal applying portion 230 applies an on/off signal, so as to control the first detection switching circuit 212 to be conductive. Upon no crack occurring in the peripheral region of the display panel, the detection circuit wire 211 is in a conducting state, and a detection voltage is applied to the detection circuit wire 120 by the voltage applying portion 220, and is applied to a first data line 120 through the first detection switching circuit 212, so that the detection circuit wire 211 and the first data line 120 form a closed loop (the loop shown by a broken-line arrow in FIG. 1B). There is no potential difference in the closed loop, and therefore, the voltage at a point P where the first sub-pixel 110 and the first data line 120 are electrically connected to each other is equal to the detection voltage (e.g., Vdd) applied by the voltage applying portion 220. And because there is no voltage difference, no driving current passes through the point P and enters the first sub-pixel 110 to which it is connected, that is, the first sub-pixel 110 does not emit light.

As illustrated by FIG. 1C, the on-off signal applying portion 230 applies an on/off signal to the first detection switching circuit 212, so as to control the first detection switching circuit 212 to be conductive. Upon a crack occurring in the peripheral region of the display panel, the detection circuit wire 211 is in a non-conducting state (for example, undergoes fracture), that is, an open circuit or nearly an open circuit is formed, and a voltage applying portion 220 can only apply a detection voltage to the first data line 120 through the first detection switching circuit 212. At this time, a closed loop shown in FIG. 1B is no longer present, and a potential difference (e.g., a voltage drop caused by the first detection switching circuit) exists between a point P where a first sub-pixel 110 and the first data line 120 are electrically connected to each other and a detection voltage applied by the voltage applying portion 220. That is, the voltage at the point P is smaller than the detection voltage applied by the voltage applying portion 220. In this case, a current for driving sub-pixel flows from the first data line 120 into the first sub-pixel 110 connected to the first data line 120 via the point P, so as to drive an organic light emitting element 1310 in the first sub-pixel 110 to emit light, that is, the first sub-pixel 110 emits light.

Figure 2:
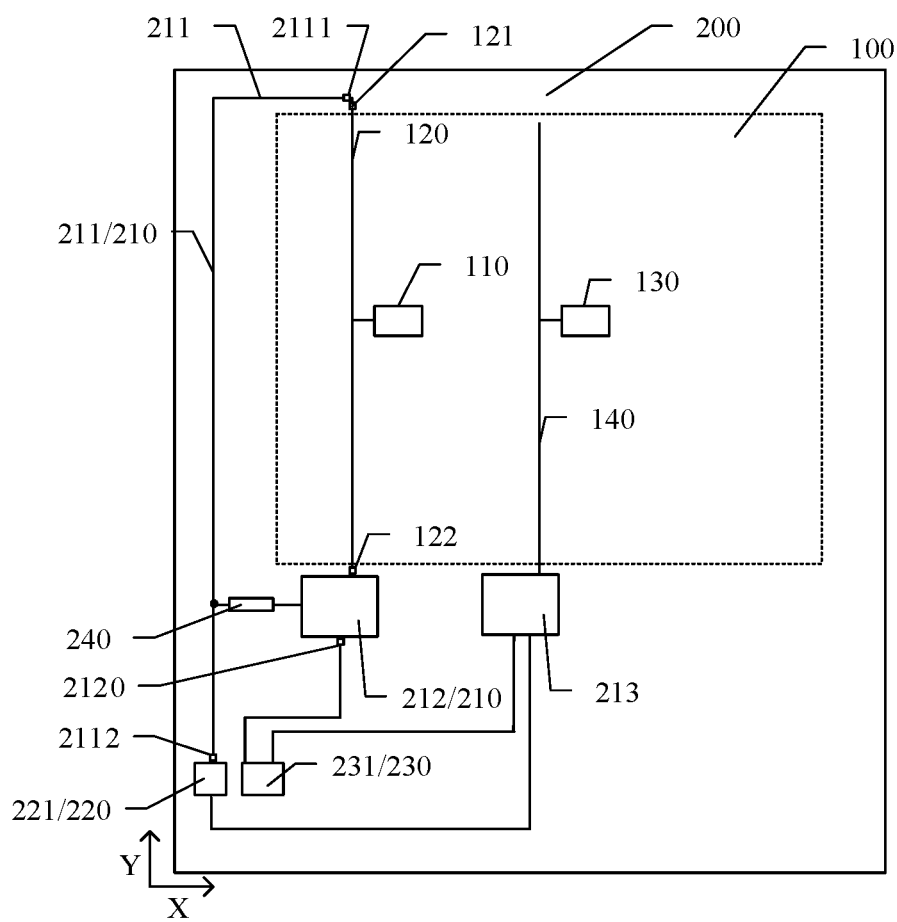
FIG. 2 is a schematic diagram of a partial simplified structure of a display panel provided by another example of an embodiment of the present disclosure.

For example, FIG. 2 is a schematic diagram of the local simplified structure of a display panel provided by another example of the present embodiment. As illustrated by FIG. 2, in this example, compared with the case shown in FIG. 1A, the display panel may further include a resistance element 240, which may be connected between the second end 122 of the first data line 120 and the first detection switching circuit 212 (not shown in the figure), or connected between the first detection switching circuit 212 and the second end 2112 of the detection circuit wire 211. In this way, a conductive path that goes from the second end 2112 of the detection circuit wire 211 to the second end 122 of the first data line 2112 and goes past the first detection switching circuit 212 needs to go through the resistance element 240. It is to be noted that, the voltage drop between the second end 122 of the first data line 120 and the first detection switching circuit 212, or between the first detection switching circuit 212 and the second end 2112 of the detection circuit wire 211 can be increased by the resistance element 240 provided by the present embodiment, thereby further improving the detection effect in the case of occurrence of a crack in the peripheral region of the display panel.

For example, in a case where the resistance element shown in FIG. 2 is provided in the principle schematic diagrams shown in FIG. 1B and FIG. 1C, upon no crack occurring in the peripheral region of the display panel, the detection circuit wire 211 is in a conducting state, and a detection voltage applied by the voltage applying portion 220 to the detection circuit wire 211 does not have a voltage drop in the process of being transmitted to a point P on the first data line 120 electrically connected to the first sub-pixel 110 through the detection circuit wire 211. Therefore, the voltage at the point P is equal to the detection voltage applied by the voltage applying portion 220. And because there is no voltage drop, no driving current passes through the point P and enters the first sub-pixel 110 connected to it, that is, the first sub-pixel 110 does not emit light.

For example, in the case that the resistance element shown in FIG. 2 is provided in the principle schematic diagrams shown in FIG. 1B and FIG. 1C, upon a crack occurring in the peripheral region of the display panel, the detection circuit wire 211 is in a non-conducting state, the voltage applying portion 220 merely applies a detection voltage to the first data line 120 through the first detection switching circuit 212, and the detection voltage applied by the voltage applying portion 220 to the first data line 120 has a voltage drop in the process of being transmitted to a point P on the first data line 120. Therefore, the voltage at the point P is smaller than the detection voltage applied by the voltage applying portion 220. A current for driving sub-pixel flows from the first data line 120 to a first sub-pixel 110 connected to it via the point P, so as to drive an organic light emitting element 1310 in it to emit light, that is, the first sub-pixel 110 emits light.

Figure 3A:
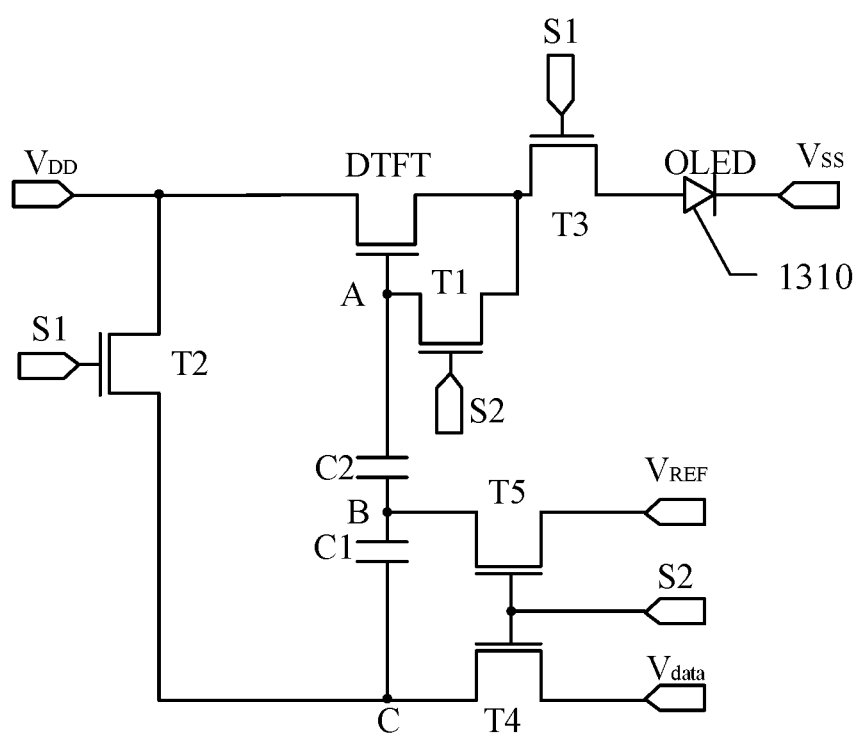
FIG. 3A is a structural schematic diagram illustrating an exemplary pixel driving circuit and an organic light emitting element included in a first sub-pixel in an embodiment of the present disclosure.
Figure 3B:
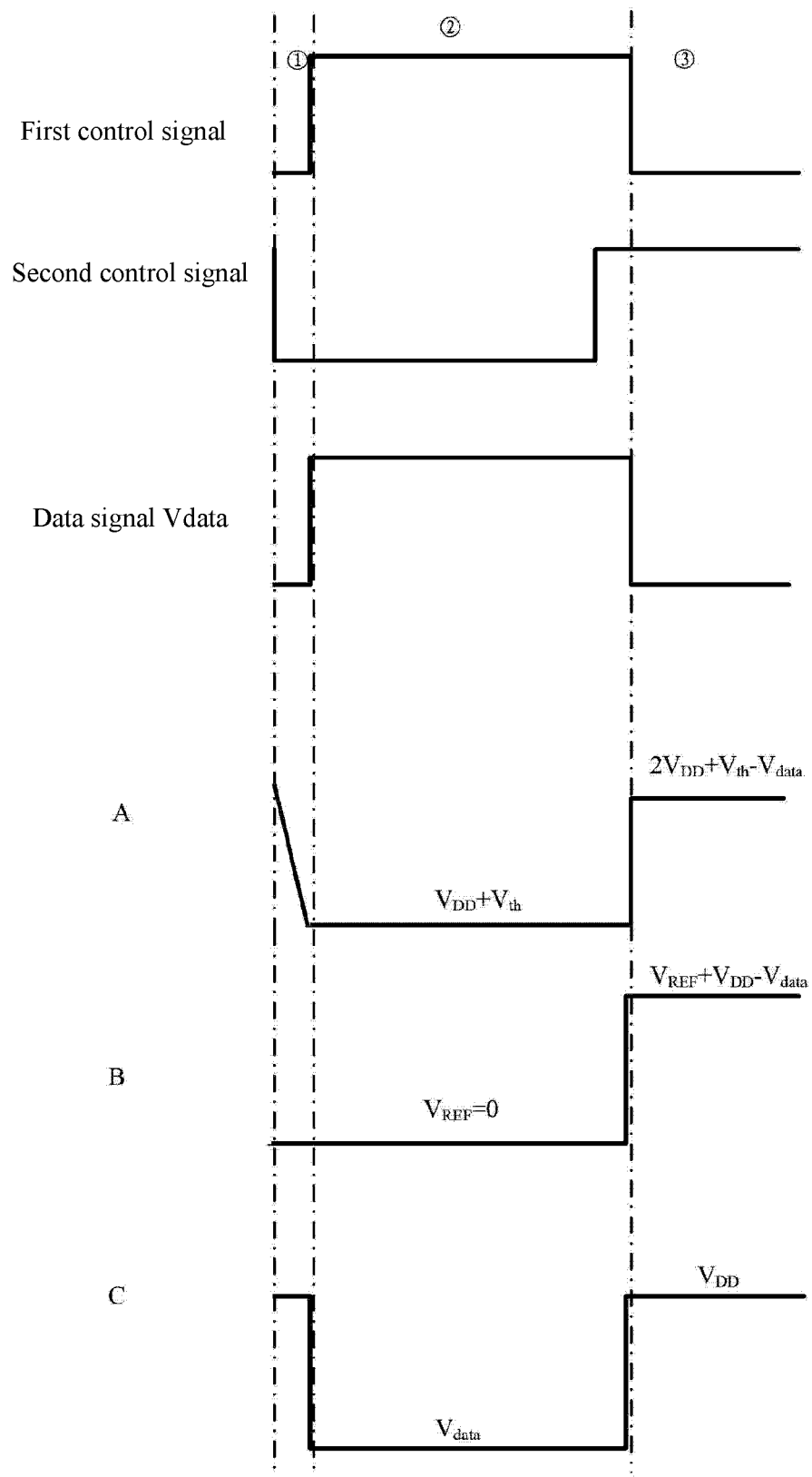
FIG. 3B is a diagram illustrating a drive timing of the exemplary pixel driving circuit shown in FIG. 3A.

FIG. 3A is a structurally schematic diagram illustrating an exemplary pixel driving circuit and an organic light emitting element included in a first sub-pixel in the present embodiment, and the exemplary pixel driving circuit is configured not to output a driving current upon the received display data voltage being equal to a power supply voltage. FIG. 3B is a diagram illustrating a drive timing of the exemplary pixel driving circuit.

As illustrated by FIG. 3A and FIG. 3B, the exemplary pixel driving circuit includes six thin film transistors (TFTs) and two capacitors C1 and C2. The six TFTs are all P-channel transistors, T1-T5 are switching transistors and DTFT is a driving transistor. The pixel driving circuit further includes two control signal terminals S1 and S2, one data signal terminal Vdata (that is, a display data signal input by a data line), and three voltage signal terminals VDD, VSS, VREF. For example, the voltage signal terminals VDD, VSS, VREF are all DC voltage signal terminals, and for example, among the voltage signal terminals VDD and VSS, the former is a high voltage terminal, while the latter is a low voltage terminal (such as grounding terminal), the voltage signal terminal VREF is a reference voltage terminal, and its voltage value may be chosen as a low voltage (such as being grounded) according to the needs.

The first stage ① shown in the timing diagram of FIG. 3B is a pixel reset phase: the first control signal S1 is of low level, the second control signal S2 is of low level, and the data signal Vdata is of low level. At this time, the switching transistors T1 to T5 are all turned on. At this time, due to the turn-on of T1, the driving transistor DTFT is in a diode connection state. At this point, the drain voltage of DTFT is VDD+Vth. At the end of the first stage, potential at a point A reaches VDD+Vth, potential at a point B is VREF, and potential at a point C is VDD.

Upon the display driving being carried out, for example, in the second stage ② of the timing diagram, that is, a data writing phase, the first control signal S1 is at a high level, the second control signal S2 is at a low level, and the data signal Vdata is at a high level. At this time, the switching transistors T1, T4 and T5 are turned on, and the switching transistors T2 and T3 are cut off. Potential at the point A is VDD+Vth, potential at the point B is VREF, potential at the point C is Vdata, and capacitors C1 and C2 are both in charging state.

In the third stage ③ shown in the timing diagram, that is, a light emitting phase, the first control signal S1 is at a low level, the second control signal S2 is at a high level, and the data signal Vdata is at a low level. At this time, the switching transistor T1, T4 and T5 are cut off, and the switching transistors T2 and T3 are turned on. The potential at the point A is 2VDD+Vth−Vdata, potential at the point B is VREF+VDD−Vdata, and potential at the point C is VDD. For the driving transistor DTFT, voltage difference between the gate electrode and the source electrode is Vgs=VDD+Vth−Vdata, DTFT is in a saturated state and charges the organic light emitting element 1310. The output current is provided as follows:

$$I=1/2*\beta*(Vgs-Vth)^2$$

$$=1/2*\beta*(VDD+Vth-Vdata-Vth)^2$$

$$=1/2*\beta*(VDD-Vdata)^2$$

Where, β is a constant value, magnitude of the driving current I is directly related to the data signal Vdata (i.e., the display data voltage) under the condition that the power supply voltage VDD is unchanged. Upon the data signal Vdata being equal to the power supply voltage VDD, the output current I of the driving transistor DTFT is zero, that is, no current flows through the organic light emitting element 1310, and correspondingly, a first sub-pixel including the pixel driving circuit does not emit light, that is, it is rendered black. Accordingly, upon the data signal Vdata being not equal to the power supply voltage VDD, the output current I of the driving transistor DTFT is not zero, that is, there is a current flowing through the organic light emitting element 1310. Accordingly, the first sub-pixel including the pixel driving circuit emits light, that is, it is rendered white, and the larger the difference between the data signal Vdata and the power supply voltage VDD is, the larger the output current I is, and the higher the gray scale presented by a corresponding sub-pixel is.

It should be understood that, the pixel driving circuit of a sub-pixel of the display panel according to an embodiment of the present disclosure is not limited to the circuit shown in FIG. 3A, and a circuit structure in other form may also be adopted, as long as the following condition is met: no driving current is outputted upon the received display data voltage being equal to the power supply voltage.

As illustrated by FIG. 1B and FIG. 3A, FIG. 3B, in the case where no crack occurs at the periphery of the display panel, in the process of crack detection, upon the detection voltage applied by the voltage applying portion 220 being a power supply voltage VDD of a pixel driving circuit of the first sub-pixel 110, because the voltage at the point P (i.e., the display data voltage on the first data line 120) is equal to the VDD applied by the voltage applying portion 220, display data voltage on the first data line 120 is Vdata=VDD. According to the above formula of driving current I, upon the display data voltage Vdata being equal to the power supply voltage VDD, the driving current I is zero, that is, no driving current flows into the organic light emitting element. Therefore, in the case where no crack occurs at the periphery of the display panel, first sub-pixels 110 (e.g., in one column) connected to the first data line 120 do not emit light. As a result, a dark line appears.

As illustrated by FIG. 1C and FIG. 3A, FIG. 3B, in the case that cracks occur at the periphery of the display panel, upon the detection voltage applied by the voltage applying portion 220 being a power supply voltage VDD, because the voltage at the point P is smaller than the detection voltage applied by the voltage applying portion 220, the display data voltage on the first data line 120 is Vdata<VDD. According to the above formula of driving current I, upon the display data voltage Vdata being not equal to the power supply voltage VDD, the driving current I is not zero, that is, there is a driving current flowing into the organic light emitting element. Therefore, in the case that cracks occur at the periphery of the display panel, first sub-pixels 110 (for example, in one column) connected to the first data line 120 emit light.

With the display panel provided by the embodiment, whether there is a crack occurring in a peripheral region can effectively be judged by aid of the light emitting situation of first sub-pixels, thereby improving the detection rate of crack in the peripheral region.

For example, a second sub-pixel provided by the present embodiment also includes the pixel driving circuit and the organic light emitting element shown in FIG. 3A. Because a second data line electrically connected to the second sub-pixel will not be electrically connected to the detection circuit wire (for example, forming a closed loop), cracks at the periphery of the display panel will not affect the light emitting state of the second sub-pixel.

Figure 4A:
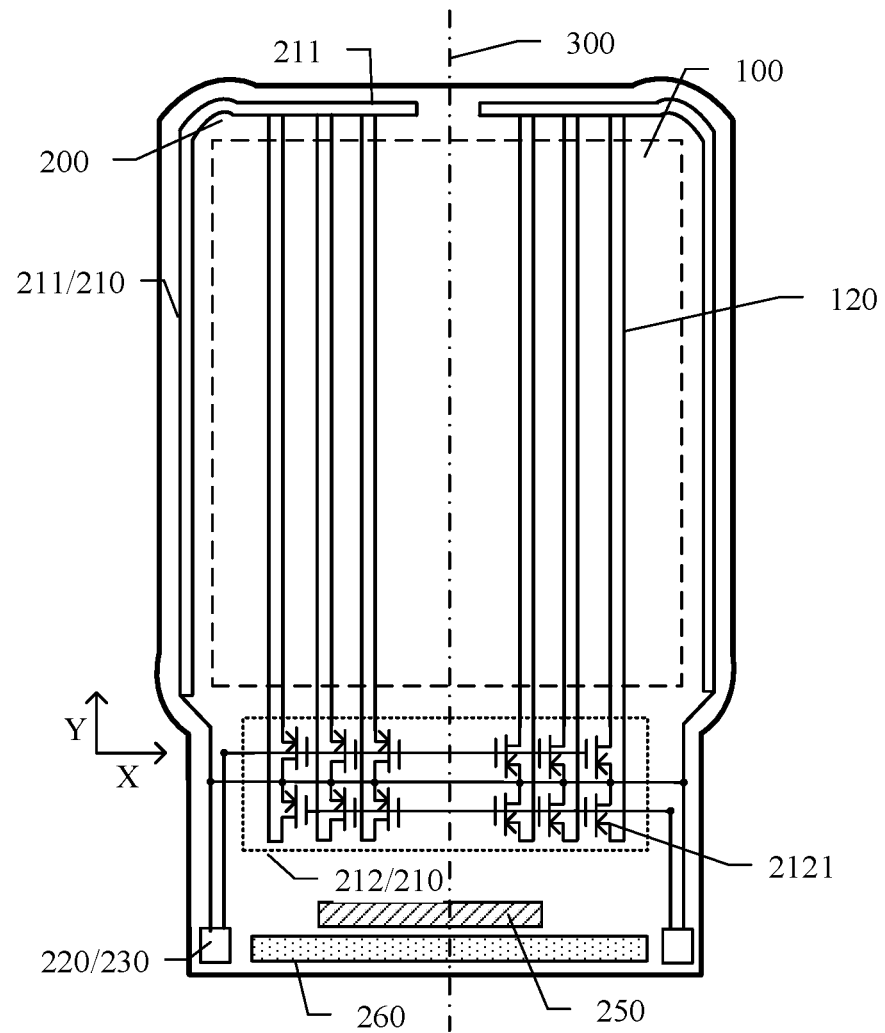
FIG. 4A is a schematic diagram of a partial structure of a display panel provided by an example of an embodiment of the present disclosure.

FIG. 4A is a schematic diagram of a partial structure of a display panel provided by an example of an embodiment of the present disclosure. The simplified structure shown in FIG. 1A or FIG. 2 is concretely implemented by the example of FIG. 4A, and the principle shown in FIG. 1B and FIG. 1C, as well as FIG. 3A and FIG. 3B, can be applied to detect whether or not cracks appear in a peripheral region.

For example, as illustrated by FIG. 4A, the peripheral region 200 of the display panel includes a bonding region (a peripheral region located below a display region in the figure), and the bonding region may, for example, be used for bonding of flexible circuit board pads, IC circuit board pads 250, etc. For example, the IC circuit may be a data drive chip.

For example, a first end of a detection circuit wire 211 is located on a side of the display region 100 far from the bonding region, a first end of a first data line 120 is located on a side of the display region 100 far from the bonding region, and a second end of the first data line 120 is located on a side of the display region 100 close to the bonding region.

For example, as illustrated by FIG. 4A, a detection circuit wire 211 is arranged in the peripheral region 200 to at least partially surround the display region 100.

For example, the detection circuit wire 211 may include a portion extending in the Y direction and a portion extending in the X direction.

For example, as illustrated by FIG. 4A, the display panel includes a center line 300 extending in the Y direction, and the detection circuit wire 211 includes two parts of wires that are located on two sides of the center line 300 and are symmetrically distributed, that is, the detection circuit wire 211 is distributed on two sides of the display region 100 in the X direction, and on a side of the display region 100 far from the bonding region.

For example, as illustrated by FIG. 4A, the two parts of detection circuit wire 211 located on left and right sides of the center line 300 are respectively two detection circuit wires without electrical connection, and in this way, the detection accuracy can be enhanced, in favor of positioning of a region on the display panel where tiny cracks occur. However, the present embodiment is not limited thereto. For example, the two parts of detection circuit wire 211 located on left and right sides of the center line 300 may also be the same detection circuit wire 211 (that is, the two parts of detection circuit wire 211 have an electrical connection relationship).

For example, as needed, more detection circuit wires 211 can be provided, each of the detection circuit wires 211 corresponds to a portion of the peripheral region of the display panel. For example, as for the case shown in FIG.

1A, one detection circuit wire is provided for each of the left peripheral region, the right peripheral region and the upper peripheral region of the display panel, respectively, and thus in the case of occurrence of tiny cracks, it can be determined by the test result that tiny cracks occur in which of the left peripheral region, the right peripheral region and the upper peripheral region.

For example, as illustrated by FIG. 4A, the number of first data lines 120 that are located on left and right sides of the center line 300, respectively, and are electrically connected to the detection circuit wire 211 may be the same, and may differ as well.

For example, as illustrated by FIG. 4A, positions of first data lines 120, that are located on left and right sides of the center line 300, respectively, and are electrically connected to the detection circuit wire 211, may be symmetrically or asymmetrically distributed relative to the center line 300, and the present embodiment is not limited thereto.

For example, in the example shown in FIG. 4A, the voltage applying portion 220 and the on-off signal applying portion 230 are both electrical signal test pads, and crack detection of the display panel is carried out at the electrical test phase of the display panel. In this case, a flexible printing circuit bonding pad 260 in the display panel has no electrical connection relationship with a crack detection circuit structure 210.

For example, as illustrated by FIG. 4A, the display panel provided in the present example includes two electrical signal test pads located on two sides (i.e. left and right sides) of the center line 300, and each of the electrical signal test pads applies a detection voltage to the two parts of the detection circuit wire 211 located on two sides of the center line 300, respectively. The present embodiment is not limited thereto, and there may also be provided only one electrical signal test pad.

For example, as illustrated by FIG. 4A, the first detection switching circuit 212 includes at least one thin film transistor 2121, a gate electrode of the thin film transistor 2121 (that is, control terminal of the first detection switching circuit 212) is electrically connected to the on-off signal applying portion 230, one of source electrode and drain electrode of the thin film transistor 2121 is electrically connected to a first data line 120, and the other of the source electrode and drain electrode of the thin film transistor 2121 is electrically connected to a second end of the detection circuit wire 211.

For example, schematically, the first detection switching circuit 212 in the example shown in FIG. 4A includes six groups of thin film transistors separately corresponding to first data lines 120 for detecting whether cracks occur in the peripheral region of the display panel, and each group of thin film transistors includes a first thin film transistor and a second thin film transistor. In each group of thin film transistors, a gate electrode of the first thin film transistor is electrically connected to an electrical signal test pad located on the left side of the center line 300, a gate electrode of the second thin film transistor is electrically connected to an electrical signal test pad located on the right side of the center line 300, a source electrode of the first thin film transistor is electrically connected to a first data line 120, a drain electrode of the first thin film transistor is electrically connected to a source electrode of the second thin film transistor and the detection circuit wire 211, and a drain electrode of the second thin film transistor is electrically connected to another first data line 120.

For example, in the process of electrical detection, the first thin film transistor and the second thin film transistor may be in a turn-on state at the same time, and it is also possible that one of them or one group is in a turn-on state to realize that the first detection switching circuit 212 is in a conducting state. The present embodiment is not limited thereto.

An example of an embodiment of the present disclosure will be described by taking a thin film transistor 2121 being a P-channel metal oxide semiconductor field effect transistor (PMOS) as an example. In the specific example shown in FIG. 4A, at the electrical test phase, an electrical signal test pad acts as an on-off signal applying portion 230 for applying a low-level signal to a gate electrode of the thin film transistor 2121, so as to control the first detection switching circuit 212 to be conductive. An electrical signal test pad is used as the voltage applying portion 220, and used for applying a high-level signal to the detection circuit wire 211 to function as the detection voltage. The example of embodiments of the present disclosure is not limited thereto, and the thin film transistor may also be an NMOS thin film transistor. In this case, an electrical signal test pad, acting as an on-off signal applying portion, applies a high level to the NMOS thin film transistor so as to control the first detection switching circuit to be conductive; likewise, an electrical signal test pad, functioning as a voltage applying portion 220, may still apply a high-level signal to the detection circuit wire 211 to act as the detection voltage.

For example, in the display panel shown in FIG. 4A, during the electrical test phase, the first detection switching circuit 212 gets conductive under control of an electrical signal test pad, and at the same time, an electrical signal test pad applies a detection voltage (for example, which is equal to the power supply voltage VDD) to the detection circuit wire 211 and the first data line 120, a first data signal for display of a black picture is applied to a second data line. In the case where a black picture is displayed by the display panel, if a first sub-pixel electrically connected to the first data line 120 emits light, then it shows that a crack appears in the peripheral region; If a first sub-pixel electrically connected to the first data line 120 does not emit light, then it shows that no crack appears in the peripheral region, and only a black picture is shown on the whole display panel at this time.

For example, in a case where the first sub-pixel is a green sub-pixel and the first data line 120 is connected to green sub-pixels in the same column, if a black picture is displayed by the display panel, and a green bright line appears on the display panel in the case that the display data voltage Vdata applied to a first sub-pixel electrically connected to the first data line 120 is VDD, it shows that a crack occurs in the peripheral region. The present example is not limited thereto, and the first sub-pixel may also be a sub-pixel of other color.

For example, in the display panel shown in FIG. 4A, during the electrical test phase, the first detection switching circuit 212 gets conductive under control of an electrical signal test pad, and at the same time, an electrical signal test pad applies a detection voltage (for example, which is equal to the power supply voltage VDD) to the detection circuit wire 211 and the first data line 120, a second data signal for display of a white picture is applied to the second data line. In the case that a white picture is displayed by the display panel, if a first sub-pixel emits light, then it shows that a crack appears in the peripheral region, and only a white picture is shown on the whole display panel at this time; if the first sub-pixel does not emit light, then it shows that no crack appears in the peripheral region.

For example, in a case where the first sub-pixel is a green sub-pixel and the first data line 120 is connected to green sub-pixels in the same column, if a white picture is displayed by the display panel, and a purple bright line appears on the display panel in the case that the display data voltage Vdata applied to a first sub-pixel electrically connected to the first data line 120 is VDD, it shows that no crack appears in the peripheral region.

FIG. 4B to FIG. 4F are schematic diagrams of the local structure of a display panel provided by other example of an embodiment of the present disclosure. Examples of FIG. 4B to FIG. 4F concretely implement the simplified structure shown in FIG. 1A or FIG. 2, respectively, and the principle shown in FIG. 1B and FIG. 1C, as well as FIG. 3A and FIG. 3B can be applied to detect whether cracks occur in the peripheral region.

Figure 4B:
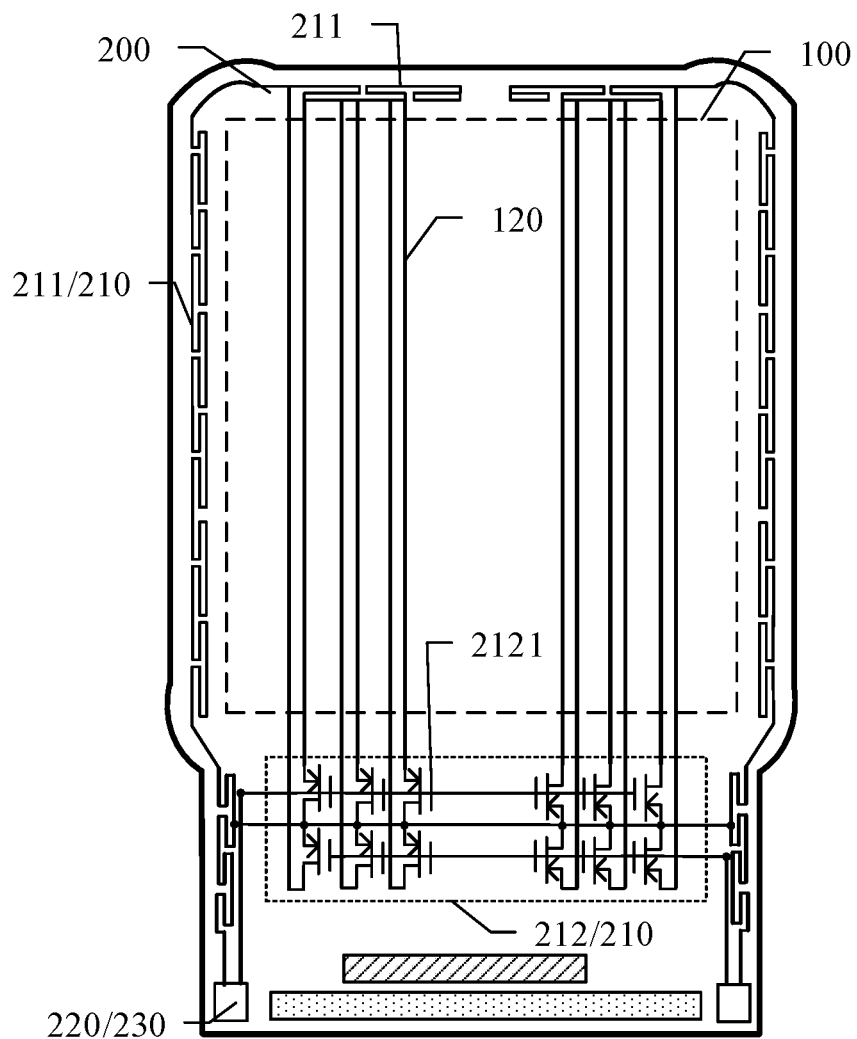
FIG. 4B is a schematic diagram of a partial structure of a display panel provided by another example of an embodiment of the present disclosure.

For example, as illustrated by FIG. 4B, unlike the example shown in FIG. 4A, a detection circuit wire 211 includes a serpentine structure (such as an S-shaped wiring, a Z-shaped wiring, a W-shaped wiring, etc.) in the example shown in FIG. 4B, the coverage for a peripheral region 200 can be improved, and thus whether cracks occur in the peripheral region of the display panel can be detected better. In addition, other structural designs in this example are the same as those in the example shown in FIG. 4A, and details are omitted here.

Figure 4C:
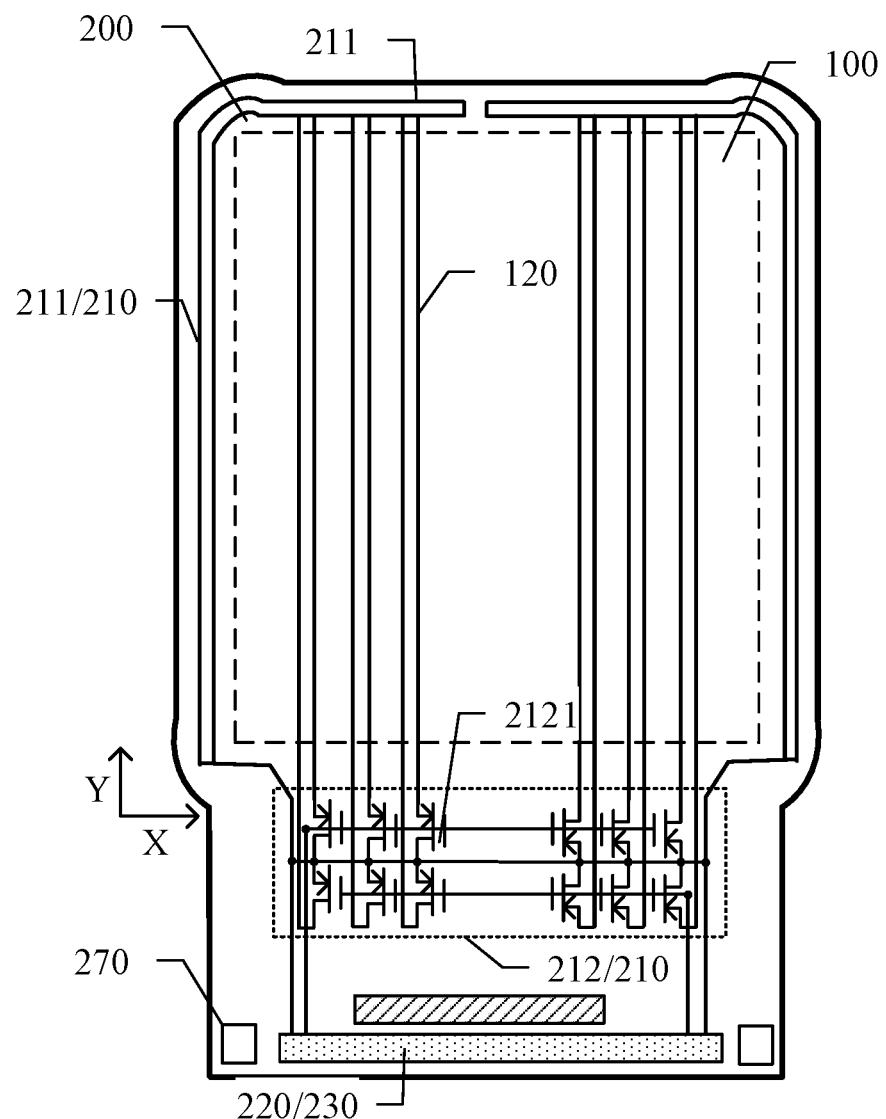
FIG. 4C is a schematic diagram of a partial structure of a display panel provided by another example of an embodiment of the present disclosure.

For example, as illustrated by FIG. 4C, unlike the example shown in FIG. 4A, a voltage applying portion 220 and an on-off signal applying portion 230 are both flexible printed circuit bonding pads in the example shown in FIG. 4C, and crack detection of the display panel is carried out at the module test phase of the display panel. Therefore, during the module test phase, a flexible printed circuit bonding pad is used not only as the voltage applying portion 220, but also as the on-off signal applying portion 230. However, an electrical signal test pad 270 has no electrical connection relationship with the crack detection circuit structure 210.

For example, the flexible printed circuit bonding pad of the display panel provided in this example include two input ports located on left and right sides of a center line (the center line 300 in FIG. 4A), thereby applying a detection voltage to the two parts of the detection circuit wire 211 located on two sides of the center line. This example is not limited thereto, and the flexible printed circuit bonding pad in this example may also include only one input port.

At the module test phase, the working principle of flexible printed circuit bonding pad is the same as that of the electrical signal test pad, and details are omitted here. In addition, other structural designs in this example are the same as those in the example shown in FIG. 4A, and details are omitted here.

Figure 4D:
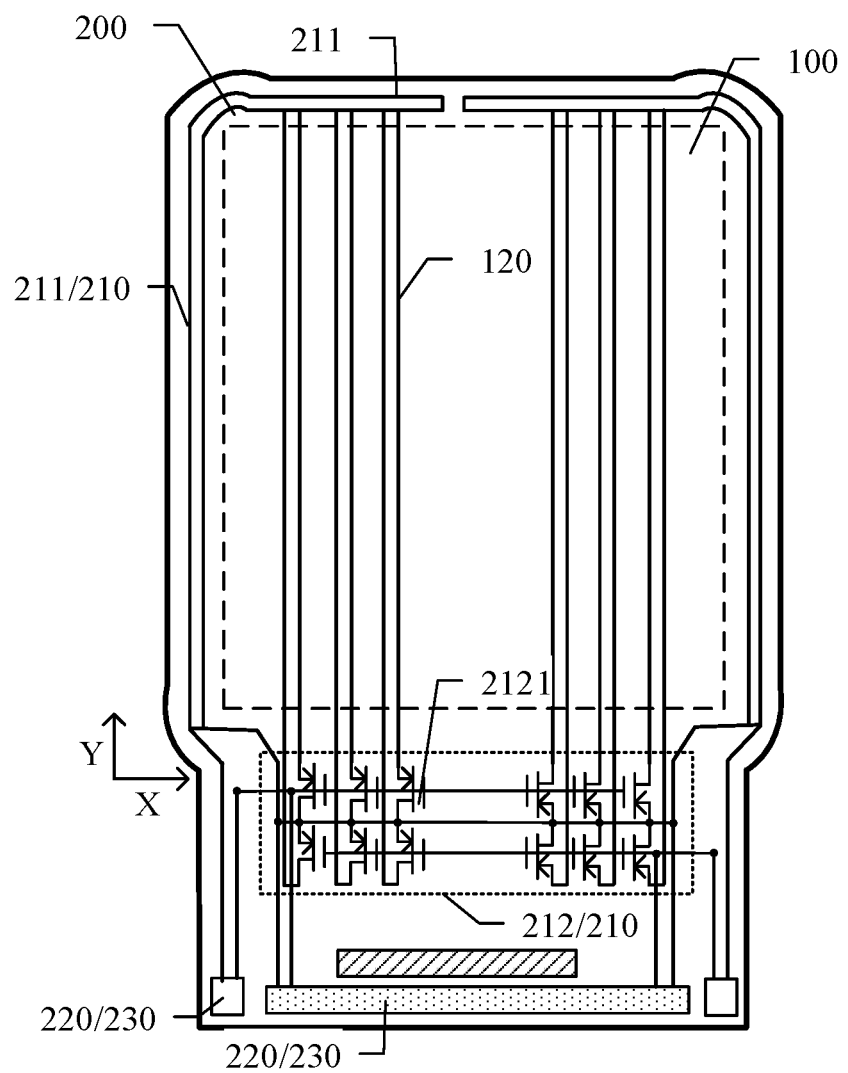
FIG. 4D is a schematic diagram of a partial structure of a display panel provided by another example of an embodiment of the present disclosure.

For example, as illustrated by FIG. 4D, unlike the example shown in FIG. 4A, at the electrical test phase, an electrical signal test pad not only includes a voltage applying portion 220, but also includes an on-off signal applying portion 230; at the module test phase, a flexible printed circuit bonding pad not only includes a voltage applying portion 220, but also includes an on-off signal applying portion 230, in the example shown in FIG. 4D. Therefore, in the example shown in FIG. 4D, the crack detection circuit structure in the display panel can detect out tiny cracks at the periphery of the display panel either during the electrical test phase, or during the module test phase.

For the embodiment shown in FIG. 4D, the voltage applying portion 220 includes both an electrical signal test pad and a flexible printed circuit bonding pad, then the corresponding crack test can be carried out either in the electrical test phase of the display panel or in the module testing phase of the display panel, and the two crack test methods do not interfere and conflict with each other.

Therefore, the crack detection circuit structure in the display panel of the embodiment can be used either in the electrical test phase, or in the module test phase, so that tiny cracks at the periphery of a display panel can be detected and defective products among display panels are picked out in time. Thus, not only such the problem can be effectively prevented that metal circuitry of display devices is corroded during the subsequent use of a defective display panel due to entrance of external water vapor into it, and then malfunction of the display panel occurs; but also the following problem will not occur: after a mobile product containing this defective display panel is used by the user for a period of time, mechanical damage is brought about by the gradual expansion of a crack, resulting in malfunction of the display screen.

For the display panel in this example, whether at the electrical test phase or at the module test phase, the principle of realizing crack detection is the same as that in the display panel shown in FIG. 4A, and details are omitted here.

In each of the above examples, at the electrical test phase, an electrical signal test pad includes both a voltage applying portion and an on-off signal applying portion; at the module testing phase, a flexible printed circuit bonding pad includes both a voltage applying portion and an on-off signal applying portion.

Figure 4E:
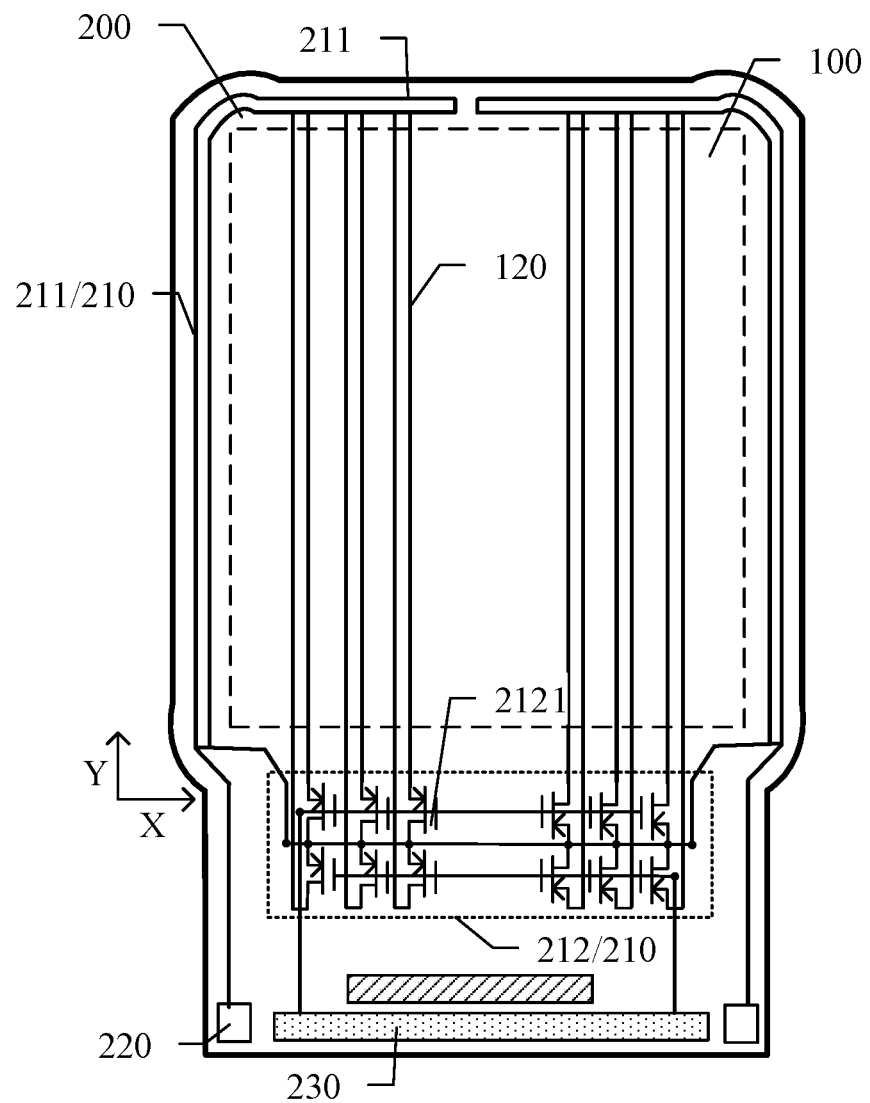
FIG. 4E is a schematic diagram of a partial structure of a display panel provided by another example of an embodiment of the present disclosure.

For example, as illustrated by FIG. 4E, unlike the example shown in FIG. 4A, the voltage applying portion 220 is an electrical signal test pad, and the on-off signal applying portion 230 is a flexible printed circuit bonding pad, in the example shown in FIG. 4E. Therefore, the electrical signal test pad is used to apply a detection voltage to a detection circuit wire 211, and the flexible printing bonding pad is used to apply an on/off signal to a first detection switching circuit 212 for control of the on or off state of the first detection switching circuit 212.

Figure 4F:
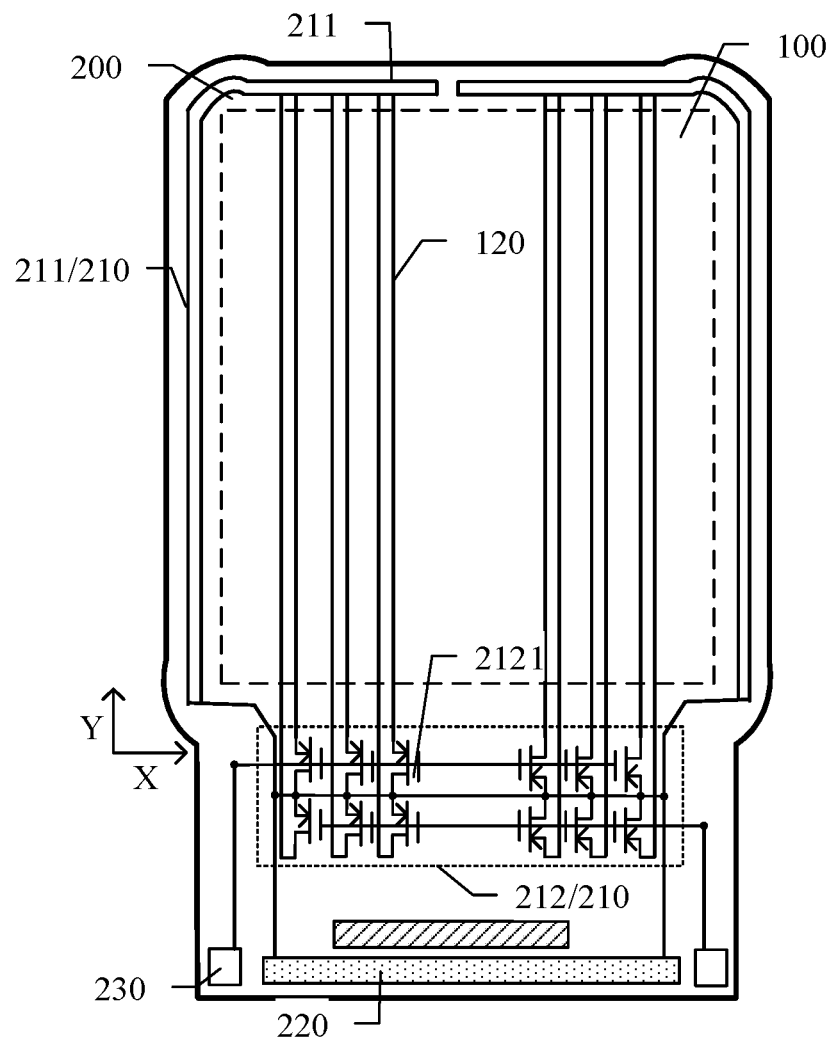
FIG. 4F is a schematic diagram of a partial structure of a display panel provided by another example of an embodiment of the present disclosure.

For example, as illustrated by FIG. 4F, unlike the example shown in FIG. 4A, the voltage applying portion 220 is a flexible printed circuit bonding pad, and the on-off signal applying portion 230 is an electrical signal test pad, in the example shown in FIG. 4F. Therefore, the flexible printed circuit bonding pad is used to apply a detection voltage to a detection circuit wire 211, and the electrical signal test pad is used to apply an on/off signal to a first detection switching circuit 212 for controlling the on or off state of the first detection switching circuit 212.

In the examples shown in FIG. 4E and FIG. 4F, an electrical signal test pad and an flexible printed circuit bonding pad may be used as a voltage applying portion and an on-off signal applying portion, respectively, so as to realize detection of crack in a peripheral region of the display panel.

Figure 5A:
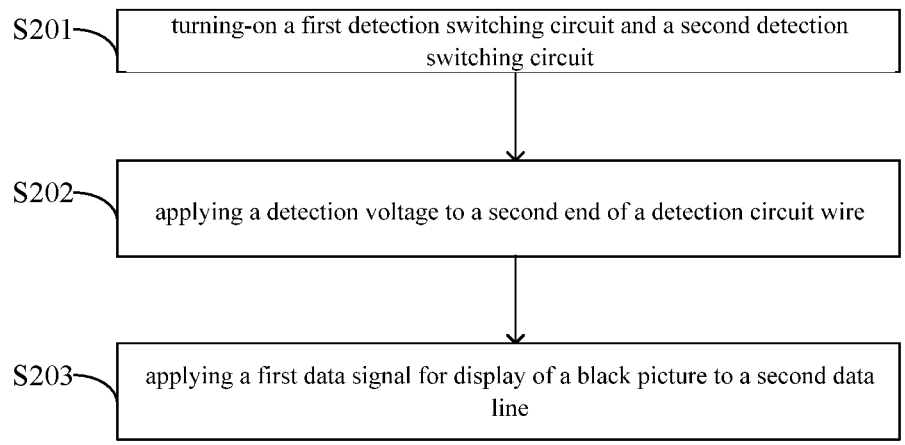
FIG. 5A is a schematic diagram illustrating a detection process of a crack detecting method of a display panel provided by an example of another embodiment of the present disclosure.

FIG. 5A is a schematic diagram illustrating the detection process of a crack detecting method for a display panel provided by an example of another embodiment of the present disclosure, and the display panel in this embodiment is the display panel provided by any of the above examples. As illustrated by FIG. 5A, the specific steps include:

S201: turning-on a first detection switching circuit and a second detection switching circuit.

S202: applying a detection voltage to a second end of a detection circuit wire.

S203: applying a first data signal for display of a black picture to a second data line.

For example, in this example, the second detection switching circuit is turned-on to be conductive firstly, and then the first data signal for display of a black picture is applied to the second data line on the display panel, so that a black picture is displayed on the display panel.

For example, in the case where a black picture is displayed by the display panel, if the first sub-pixel emits light, then it is judged that a crack appears in the peripheral region. For example, upon the first sub-pixel being a green sub-pixel, and a first data line is connected to green sub-pixels in the same column, if a green bright line appears on the display panel upon a black picture being displayed on the display panel, then it is judged that a crack appears in the peripheral region.

For example, in the case where a black picture is displayed by the display panel, if a first sub-pixel does not emit light, then it is judged that no crack appears in the peripheral region. In this case, only a black picture is shown on the whole display panel.

For example, the crack detecting method provided in this example can detect whether there is a crack occurring in the peripheral region of the display panel either in the electrical test phase, or in the module test phase, and this example is not limited thereto.

In this example, upon the display panel displaying a black picture, it is possible to judge whether there is a crack occurring in the peripheral region of the display panel by aid of the light emitting situation of the first sub-pixel.

Figure 5B:
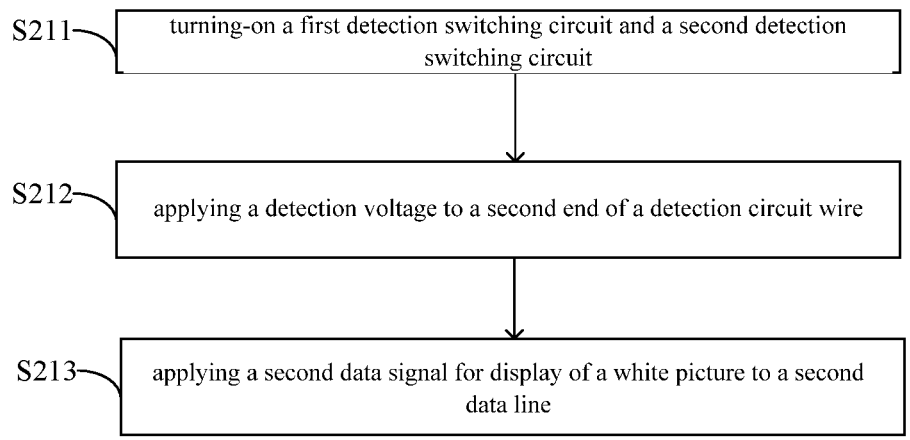
FIG. 5B is a schematic diagram illustrating a detection process of a crack detecting method of a display panel provided by another example of another embodiment of the present disclosure.

FIG. 5B is a schematic diagram illustrating the detection process of a crack detecting method for a display panel provided by an example of another embodiment of the present disclosure, and the display panel in this embodiment is the display panel provided by any of the above examples. As illustrated by FIG. 5B, the specific steps include:

S211: turning-on a first detection switching circuit and a second detection switching circuit.

S212: applying a detection voltage to a second end of a detection circuit wire.

S213: applying a second data signal for display of a white picture to a second data line.

For example, in this example, the second detection switching circuit is turned-on to be conductive firstly, and then the second data signal for display of a white picture is applied to the second data line of the display panel, so that a white picture is displayed on the display panel.

For example, in the case where a white picture is displayed by the display panel, if a first sub-pixel does not emit light, then it is judged that no crack appears in the peripheral region. For example, upon the first sub-pixel being a green sub-pixel, and a first data line being connected to green sub-pixels in the same column, if a purple bright line appears on the display panel upon a white picture being displayed on the display panel, then it is judged that no crack appears in the peripheral region.

For example, in the case where a white picture is displayed by the display panel, if a first sub-pixel emits light, then it is judged that a crack appears in the peripheral region. In this case, only a white picture is displayed on the whole display panel.

For example, the crack detecting method provided in this example can detect whether there is a crack occurring in the peripheral region of the display panel either in the electrical test phase, or in the module test phase, and this example is not limited to this.

In this example, upon the display panel displaying a white picture, it is possible to judge whether there is a crack occurring in the peripheral region of the display panel by aid of the light emitting situation of the first sub-pixel.

Another embodiment of the present disclosure provides a display apparatus, which includes the display panel provided by any of the above examples. The display apparatus provided by the present embodiment can be used to detect out tiny cracks in the periphery of the display apparatus either in the electrical test phase, or in the module test phase, so that defective products can be picked out in time. Thus, not only such a problem can be effectively prevented that metal circuitry inside it is corroded during the subsequent use of a defective display apparatus due to entrance of external water vapor into it, and then malfunction of the display apparatus occurs; but also the following problem will not occur: after this defective display apparatus is used by the user for a period of time, mechanical damage is brought about by the gradual expansion of a crack, resulting in malfunction of a display screen.

For example, the display apparatus is a display apparatus such as an organic light-emitting diode (OLED) display apparatus or the like and any product or component having a display function that includes the display apparatus, such as a television, a digital camera, a watch, a tablet computer, a notebook computer, a navigator, etc., and this embodiment is not limited thereto.

The following points should be noted:

(1) The accompanying drawings in the embodiments of the present disclosure only involve structures relevant to the embodiments of the present disclosure, and other structures may refer to the common design.

(2) In case of no conflict, features in one embodiment or in different embodiments can be combined.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A display panel, comprising a display region and a peripheral region surrounding the display region, the peripheral region being provided with a crack detection circuit structure, the crack detection circuit structure comprising a detection circuit wire and a first detection switching circuit,
   wherein the display panel comprises a first sub-pixel and a first data line electrically connected to the first sub-pixel, the first data line comprises a first end and a second end, the first end and the second end are two opposite ends of the first data line along an extending direction of the first data line,
   the detection circuit wire comprises a first end and a second end, the first end of the detection circuit wire is located at a side of the display region away from the first detection switching circuit, and the second end of the detection circuit wire is located at a side of the display region away from the first end of the detection circuit wire, the first end of the first data line is directly connected to the first end of the detection circuit wire,
   the first detection switching circuit comprises a thin film transistor, a source electrode of the thin film transistor is connected to the second end of the detection circuit wire, a drain electrode of the thin film transistor is directly connected to the second end of the first data line, the second end of the detection circuit wire is configured to receive a detection voltage.

2. The display panel according to claim 1, wherein the detection voltage is equal to a power supply voltage.

3. The display panel according to claim 1, further comprising a voltage applying portion, wherein the voltage applying portion is electrically connected to the second end of the detection circuit wire and is configured to apply the detection voltage to the detection circuit wire.

4. The display panel according to claim 3, wherein the voltage applying portion comprises a first contact pad disposed in the peripheral region,
the first contact pad is configured to contact a detection probe.

5. The display panel according to claim 3, wherein the voltage applying portion comprises a first contact pad disposed in the peripheral region, the first contact pad is configured to be electrically connected to a drive circuit board.

6. The display panel according to claim 1 further comprising an on-off signal applying portion, wherein the on-off signal applying portion is electrically connected to a control terminal of the first detection switching circuit, and is configured to apply an on/off signal to the first detection switching circuit so as to control on or off state of the first detection switching circuit.

7. The display panel according to claim 6, wherein the on-off signal applying portion comprises a second contact pad disposed in the peripheral region,
the second contact pad is configured to contact a detection probe or to be electrically connected to a drive circuit board.

8. The display panel according to claim 6, wherein the voltage applying portion comprises a second contact pad disposed in the peripheral region,
the second contact pad is configured to be electrically connected to a drive circuit board.

9. The display panel according to claim 7, wherein the first detection switching circuit comprises at least one thin film transistor,
a gate electrode of the thin film transistor is electrically connected to the on-off signal applying portion,
one of a source electrode and a drain electrode of the thin film transistor is electrically connected to the first data line, and the other one of the source electrode and the drain electrode of the thin film transistor is electrically connected to the second end of the detection circuit wire.

10. The display panel according to claim 7, further comprising a resistance element, wherein the resistance element is connected between the second end of the first data line and the first detection switching circuit, or connected between the first detection switching circuit and the second end of the detection circuit wire.

11. The display panel according to claim 1, wherein the detection circuit wire is disposed to surround the display region.

12. The display panel according to claim 1, wherein the detection circuit wire comprises a serpentine structure.

13. The display panel according to claim 7, wherein the display region is further provided with a second sub-pixel and a second data line electrically connected to the second sub-pixel,
the display panel further comprises a second detection switching circuit, and the on-off signal applying portion is connected to a control terminal of the second detection switching circuit,
the second data line is electrically connected to the second detection switching circuit and is capable of receiving a data signal of the display panel for display of a black picture or a white picture through the second detection switching circuit.

14. The display panel according to claim 13, wherein luminous color of the first sub-pixel and the second sub-pixel differs.

15. The display panel according to claim 13, wherein each of the first sub-pixel and the second sub-pixel comprises a pixel driving circuit and an organic light emitting element, and the pixel driving circuit is configured not to output a driving current upon the received display data voltage being equal to a power supply voltage.

16. A display apparatus, comprising the display panel according to claim 1.

17. A crack detecting method of a display panel, wherein the display panel is the display panel according to claim 1, the method comprises:
displaying a black picture by using the display panel, turning on the first detection switching circuit, and applying the detection voltage to the second end of the detection circuit wire; or
displaying a white picture by using the display panel, turning on the first detection switching circuit, and applying the detection voltage to the second end of the detection circuit wire.

18. The crack detecting method according to claim 17, wherein in a case of displaying the black picture, if the first sub-pixel emits light, then it is judged that a crack appears in the peripheral region; or,
in a case of displaying the white picture, if the first sub-pixel does not emit light, then it is judged that no crack appears in the peripheral region.

19. The crack detecting method according to claim 1, wherein the first sub-pixel and the first data line are located in the display region.

* * * * *